United States Patent
Bhat et al.

(10) Patent No.: US 11,387,085 B2
(45) Date of Patent: Jul. 12, 2022

(54) MULTICATHODE DEPOSITION SYSTEM

(71) Applicant: Applied Materials, Inc., Santa Clara, CA (US)

(72) Inventors: Sanjay Bhat, Bangalore (IN); Vibhu Jindal, San Jose, CA (US); Kamatchigobinath Manoharan, Tamilnadu (IN)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 16/536,641

(22) Filed: Aug. 9, 2019

(65) Prior Publication Data
US 2020/0051797 A1 Feb. 13, 2020

Related U.S. Application Data (60) Provisional application No. 62/717,294, filed on Aug. 10, 2018.

(51) Int. Cl.
| | | |
|---|---|---|
| *H01J 37/34* | (2006.01) | |
| *C23C 14/34* | (2006.01) | |
| *C23C 14/14* | (2006.01) | |

(52) U.S. Cl.
CPC .......... *H01J 37/3441* (2013.01); *C23C 14/14* (2013.01); *C23C 14/3464* (2013.01)

(58) Field of Classification Search
CPC ............... H01J 37/3441; H01J 37/3417; H01J 37/3447; C23C 14/14; C23C 14/3464; C23C 14/352; C23C 28/42; C23C 28/023; C23C 28/40; C23C 28/02; C23C 14/165; C23C 14/185; C23C 14/3407
USPC ................................................... 204/298.11
See application file for complete search history.

(56) References Cited

U.S. PATENT DOCUMENTS

| | | | |
|---|---|---|---|
| 4,225,744 A * | 9/1980 | Jones ....................... | B01J 3/002 373/135 |
| 6,184,489 B1 * | 2/2001 | Ito ...................... | H01J 37/32431 219/121.43 |
| 7,365,351 B2 | 4/2008 | Bowering et al. | |
| 2002/0090464 A1 * | 7/2002 | Jiang ...................... | C23C 14/564 427/446 |
| 2003/0085121 A1 * | 5/2003 | Powell .................. | C23C 14/564 204/298.11 |
| 2003/0146085 A1 * | 8/2003 | Lawson .............. | H01J 37/3441 204/192.12 |
| 2005/0039679 A1 * | 2/2005 | Kieshock .............. | C23C 14/564 118/715 |

(Continued)

FOREIGN PATENT DOCUMENTS

KR 101271560 B1 6/2013

OTHER PUBLICATIONS

PCT International Search Report and Written Opinion in PCT/US2019/045917 dated Nov. 18, 2019, 12 pages.

*Primary Examiner* — Jennifer Wecker
*Assistant Examiner* — Patrick S Ott
(74) *Attorney, Agent, or Firm* — Servilla Whitney LLC (57) ABSTRACT

A physical vapor deposition (PVD) chamber and a method of operation thereof are disclosed. Chambers and methods are described that provide a chamber comprising one or more of contours that reduce particle defects, temperature control and or measurement and and/or voltage particle traps to reduce processing defects.

17 Claims, 8 Drawing Sheets

(56) References Cited

U.S. PATENT DOCUMENTS

| | | | |
|---|---|---|---|
| 2006/0137970 A1* | 6/2006 | Ahn | H01J 37/3447 |
| | | | 204/192.15 |
| 2007/0080059 A1 | 4/2007 | Takahashi | |
| 2008/0237182 A1 | 10/2008 | Yamawaku et al. | |
| 2009/0283037 A1 | 11/2009 | Hardikar et al. | |
| 2009/0294279 A1 | 12/2009 | Kikuchi et al. | |
| 2011/0155561 A1* | 6/2011 | Otani | C23C 14/088 |
| | | | 204/192.12 |
| 2011/0186426 A1* | 8/2011 | Hawrylchak | H01L 21/68714 |
| | | | 204/298.11 |
| 2015/0096881 A1* | 4/2015 | Tsunekawa | C23C 14/505 |
| | | | 204/192.12 |
| 2016/0027623 A1* | 1/2016 | Ishihara | C23C 14/3464 |
| | | | 204/298.07 |
| 2016/0189936 A1* | 6/2016 | Chia | C23C 16/45563 |
| | | | 156/345.33 |
| 2017/0076924 A1* | 3/2017 | Johanson | H01J 37/3441 |
| 2018/0151337 A1 | 5/2018 | Nguyen et al. | |

\* cited by examiner

MULTICATHODE DEPOSITION SYSTEM

CROSS-REFERENCE TO RELATED APPLICATIONS

This application claims priority to U.S. Provisional Application No. 62/717,294, filed Aug. 10, 2018, the entire disclosure of which is hereby incorporated by reference herein.

TECHNICAL FIELD

The present disclosure relates generally to substrate processing systems, and more specifically, to deposition systems with multiple cathode assemblies (multi-cathodes) having one or more features to reduce particles and control temperature during processing.

BACKGROUND

Sputtering, alternatively called physical vapor deposition (PVD), is used for the deposition of metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively affect the properties of the final product.

Plasma sputtering may be accomplished using either DC sputtering or RF sputtering. Plasma sputtering typically includes a magnetron positioned at the back of the sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Argon is admitted to the chamber. When a negative DC bias of several hundred volts is applied to target while the chamber walls or shields remain grounded, the argon is excited into a plasma. The positively charged argon ions are attracted to the negatively biased target at high energy and sputter target atoms from the target.

While advancements in PVD chamber design have been made, there remains a need to reduce defect sources such as particles, improve the temperature control of the PVD chamber, particular in the lower shield, and to capture undesired particles in the chamber.

SUMMARY

A physical vapor deposition (PVD) chamber is provided that includes a plurality of cathode assemblies, an upper shield below the plurality of cathode assemblies having a shield hole to expose one of the plurality of cathode assemblies, and a lower shield below the upper shield. The lower shield has an upper end in contact with the upper shield, a lower end opposite the upper end, and a lower shield wall comprising a height "H" extending from the upper end to the lower end and a lower shield wall inner surface. The lower shield wall inner surface has a straight region extending from the upper end to about 0.8H, wherein the straight region is free of bends on the lower shield wall inner surface having an angle in a range of from about 0.1 degrees to about 120 degrees and in a range of from about 210 degrees to about 360 degrees.

According to a second aspect, a PVD chamber is provided that includes a plurality of cathode assemblies, an upper shield below the plurality of cathode assemblies having a shield hole to expose one of the plurality of cathode assemblies, and a lower shield below the upper shield, the lower shield having an upper end in contact with the upper shield, a lower end opposite the upper end, and a lower shield wall comprising a height "H" extending from the upper end to the lower end, and one or more heating elements adjacent to the lower shield.

According to a third aspect, a method of depositing a material layer is provided. The method includes placing a substrate in a PVD chamber that includes a plurality of cathode assemblies, an upper shield below the plurality of cathode assemblies having a shield hole to expose one of the plurality of cathode assemblies, and a lower shield below the upper shield, the lower shield having an upper end in contact with the upper shield, a lower end opposite the upper end, and a lower shield wall comprising a height "H" extending from the upper end to the lower end and a lower shield wall inner surface, in which the lower shield wall inner surface has a straight region extending from the upper end to about 0.8H wherein the straight region is free of bends on the lower shield wall inner surface having an angle in a range of from about 0.1 degrees to about 120 degrees and in a range of from about 210 degrees to about 360 degrees. The method also includes heating the lower shield with one or more heating elements disposed adjacent to the lower shield.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

Embodiments of the disclosure pertain to a magnet design for a deposition system, for example a physical vapor deposition ("PVD") chamber comprising at least one cathode assembly, and in particular embodiments, a PVD chamber comprising multiple cathode assemblies (referred to herein as a "multi-cathode chamber).

Figure 1:
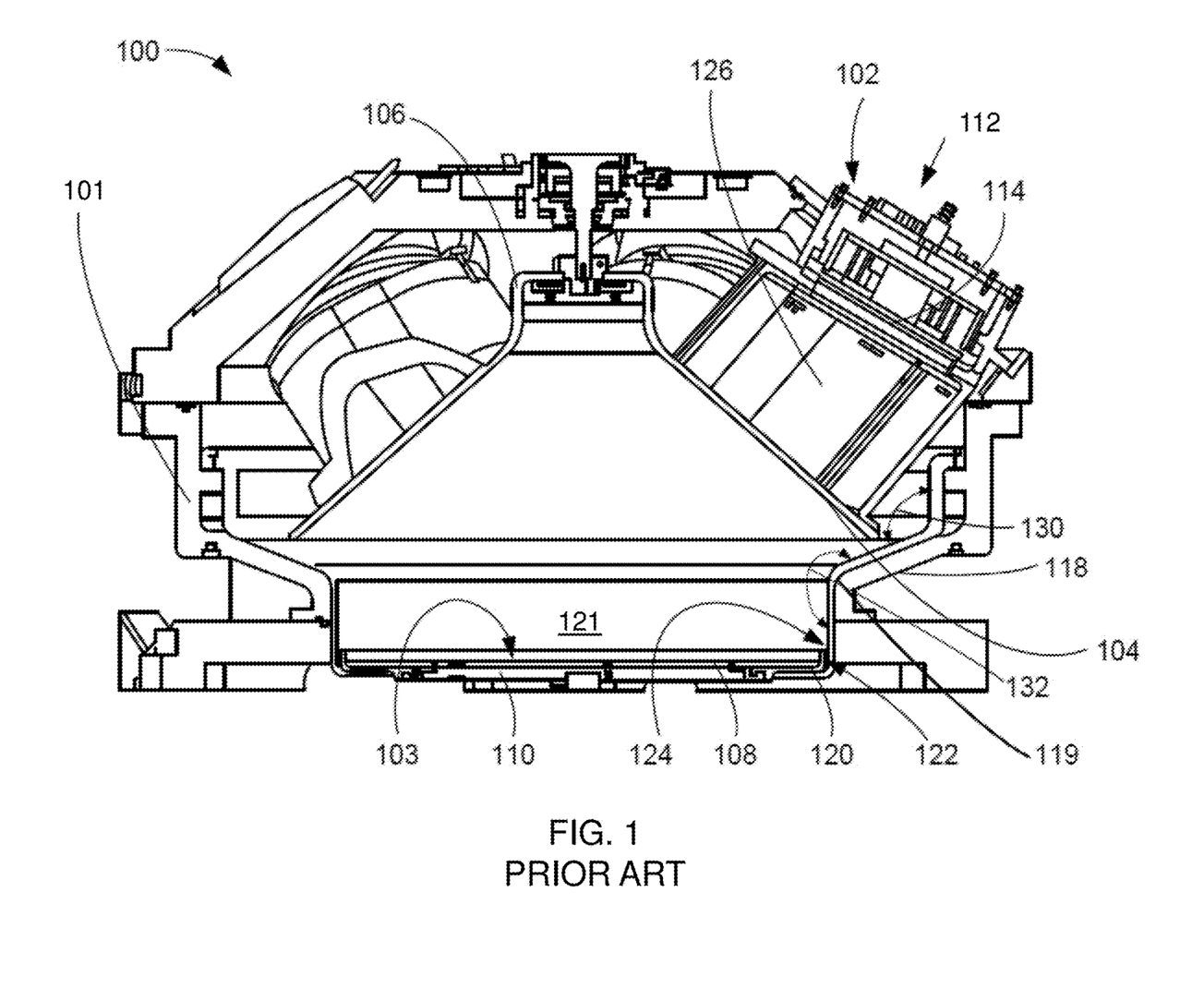
FIG. 1 is a side view of a prior art deposition system.

FIG. 1 shows a prior art deposition system, in which a side view of a portion of a deposition system in the form of a PVD chamber 100 is shown. The deposition system in the form of a PVD chamber is shown as a multi-cathode PVD chamber 100 including a plurality of cathode assemblies 102. The multi-cathode PVD chamber 100 is shown as including a multi-target PVD source configured to manufacture an MRAM (magnetoresistive random access memory) or a multi-target PVD source configured to manufacture an extreme ultraviolet (EUV) mask blank.

The multi-cathode PVD chamber comprises a chamber body 101, comprising an adapter (not shown) configured to hold a plurality of cathode assemblies 102 in place in a spaced apart relationship. The multi-cathode PVD chamber 100 in some embodiments includes a plurality cathode assemblies 102 for PVD and sputtering. Each of the cathode assemblies 102 is connected to a power supply 112 including direct current (DC) or radio frequency (RF).

The cross-sectional view depicts an example of a PVD chamber 100 including the chamber body 101 defining an inner volume 121, where a substrate or carrier is processed.

The cathode assemblies 102 in the embodiment shown in FIG. 1 in some embodiments are used for sputtering different materials as a material layer 103. The cathode assemblies 102 exposed through shield holes 104 of an upper shield 106, which is disposed over the substrate or carrier 108 on a rotating pedestal 110. There may generally be only one carrier 108 over or on the rotating pedestal 110.

The substrate or carrier 108 is shown as a structure having a semiconductor material used for fabrication of integrated circuits. For example, the substrate or carrier 108 comprises a semiconductor structure including a wafer. Alternatively, the substrate or carrier 108 in some embodiments is another material, such as an ultra low expansion glass substrate used to form an EUV mask blank. The substrate or carrier 108 can be any suitable shape such as round, square, rectangular or any other polygonal shape.

The upper shield 106 is formed with the shield holes 104 so that the cathode assemblies 102 in some embodiments are used to deposit the material layers 103 through the shield holes 104. A power supply 112 is applied to the cathode assemblies 102. The power supply 112 in some embodiments include a direct current (DC) or radio frequency (RF) power supply.

The upper shield 106 is configured to expose one of the cathode assemblies 102 at a time and protect other cathode assemblies 102 from cross-contamination. The cross-contamination is a physical movement or transfer of a deposition material from one of the cathode assemblies 102 to another of the cathode assemblies 102. The cathode assemblies 102 are positioned over targets 114. A design of a chamber in some embodiments is compact. The targets 114 in some embodiments are any suitable size. For example, each of the targets 114 in some embodiments is a diameter in a range of from about 4 inches to about 20 inches, or from about 4 inches to about 15 inches, or from about 4 inches to about 10 inches, or from about 4 inches to about 8 inches or from about 4 inches to about 6 inches.

In FIG. 1, the substrate or carrier 108 is shown as being on the rotating pedestal 110, which in some embodiments vertically move up and down. Before the substrate or carrier 108 moves out of the chamber, the substrate or carrier 108 in some embodiments moves below a lower shield 118. A telescopic cover ring 120 abuts the lower shield 118. Then, the rotating pedestal 110 in some embodiments move down, and then the carrier 108 is raised with a robotic arm before the carrier 108 moves out of the chamber.

When the material layers 103 are sputtered, the materials sputtered from the targets 114 in some embodiments are retained inside and not outside of the lower shield 118. In this prior art embodiment, telescopic cover ring 120 includes a raised ring portion 122 that curves up and has a predefined thickness. The telescopic cover ring 120 in some embodiments are includes a predefined gap 124 and a predefined length with respect to the lower shield 118. Thus, the materials that form material layers 103 will not be below the rotating pedestal 110 thereby eliminating contaminants from spreading to the substrate or carrier 108.

FIG. 1 depicts individual shrouds 126. The shrouds 126 in some embodiments are designed such that a majority of the materials from the targets 114 that does not deposit on the carrier 108 is contained in the shrouds 126, hence making it easy to reclaim and conserve the materials. This also enables one of the shrouds 126 for each of the targets 114 to be optimized for that target to enable better adhesion and reduced defects.

The shrouds 126 in some embodiments are designed to minimize cross-talk or cross-target contamination between the cathode assemblies 102 and to maximize the materials captured for each of the cathode assemblies 102. Therefore, the materials from each of the cathode assemblies 102 would just be individually captured by one of the shrouds 126 over which the cathode assemblies 102 are positioned. The captured materials may not be deposited on the substrate or carrier 108. For example, a first cathode assembly and a second cathode assembly in some embodiments apply alternating layers of different materials in the formation of an extreme ultraviolet mask blank, for example, alternating layers of silicon deposited from a first target and cathode assembly 102 and a molybdenum from a second target and cathode assembly 102.

The substrate or carrier 108 in some embodiments are coated with uniform material layer 103 deposited on a surface of the substrate or carrier 108 using the deposition materials including a metal from the targets 114 over the shrouds 126. Then, the shrouds 126 are taken through a recovery process. The recovery process not only cleans the shrouds 126 but also recovers a residual amount of the deposition materials remained on or in the shrouds 126. For example, there may be molybdenum on one of the shrouds 126 and then silicon on another of the shrouds 126. Since molybdenum is more expensive than silicon, the shrouds 126 with molybdenum are sent out for the recovery process.

As shown in FIG. 1, the lower shield 118 is provided with a first bend resulting from small angle 130 and a second bend resulting from large angle 132, which results in a knee 119 in the lower shield 118. This knee 119 provides an area in which particles can accumulate during deposition, and is thus a possible source for processing defects.

Figure 2:
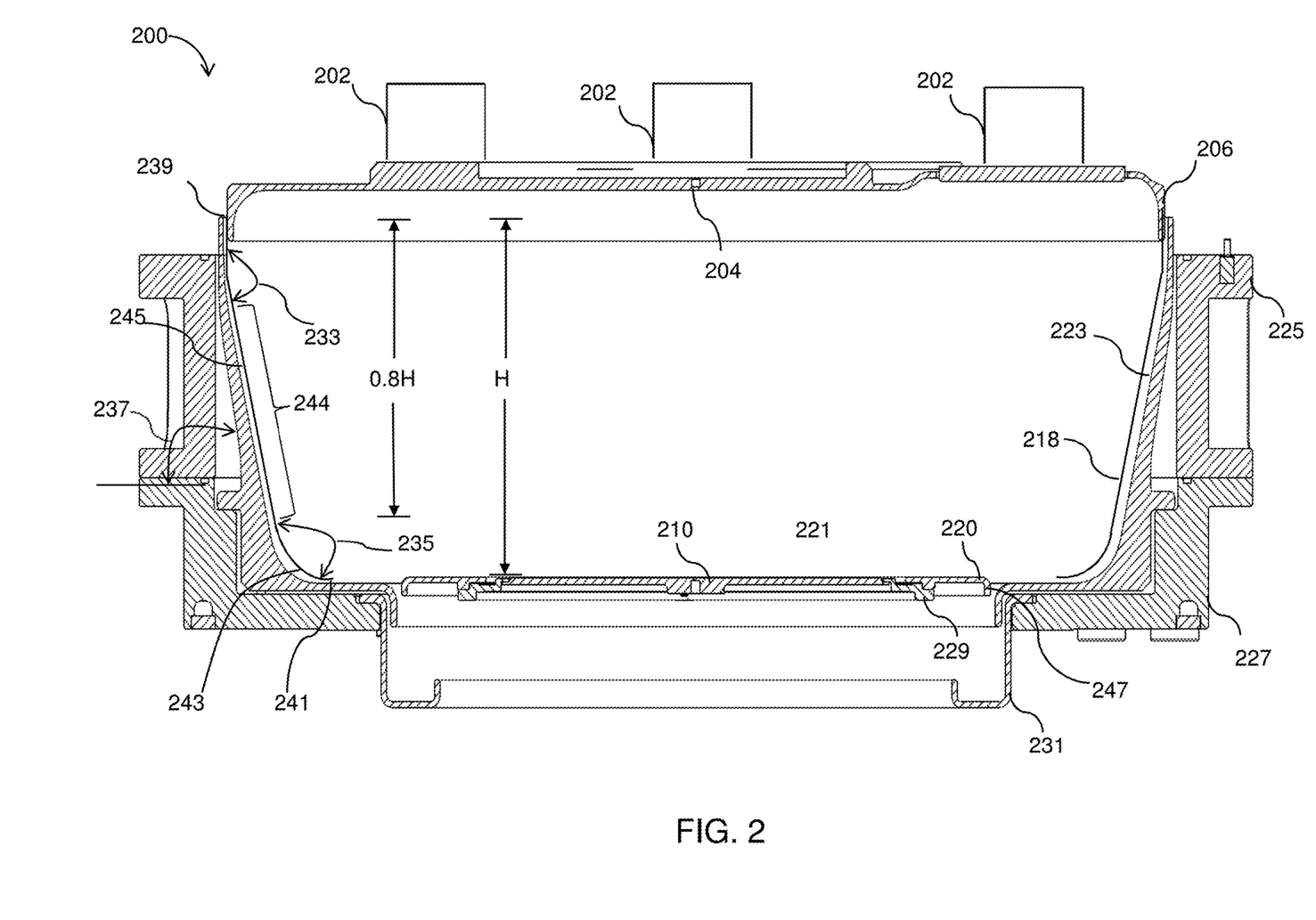
FIG. 2 is a side view of a PVD chamber according to one or more embodiments.

FIG. 2 depicts a PVD chamber 200 in accordance with a first embodiment of the disclosure. PVD chamber 200 includes a plurality of cathode assemblies 202. An upper shield 206 is provided below the plurality of cathode assemblies 202, the upper shield 206 having one or more shield holes 204 to expose the cathode assembly to the interior space 221 of the chamber (only one shield hole 204 depicted in FIG. 2 for clarity). A lower shield 218 is provided below and adjacent upper shield 206.

A modular chamber body is disclosed in FIG. 2, in which an intermediate chamber body 225 is located above and adjacent a lower chamber body 227. The intermediate chamber body 225 is secured to the lower chamber body 227 to form the modular chamber body, which surrounds lower shield 218. A lower shield liner 223 maintains the same general contour as lower shield 218, lower shield liner 223 being disposed between intermediate chamber body 225 and lower chamber body 227 (i.e., the modular chamber body) and the lower shield 218 to also surround lower shield 218. A top adapter 273 (shown in FIG. 8) is disposed above intermediate chamber body 225 to surround upper shield 206.

PVD chamber 200 is also provided with a rotating pedestal 210 similar to rotating pedestal 110 in FIG. 1. A person of ordinary skill will readily appreciate that other components of a PVD chamber, such as those referenced above in FIG. 1 but omitted in FIG. 2 for the sake of clarity, are provided in PVD chamber 200 according to one or more embodiments.

In PVD chamber 200 cover ring 220 is provided with a peripheral lip defining sidewalls 247 that face away from the upper shield 206, whereas cover ring 120 in FIG. 1 is provided with a raised ring portion 122 and thus has upward facing sidewalls (i.e., sidewalls that face toward upper shield 106). Furthermore, PVD chamber 200 is provided with a bottom liner 231 and a deposition ring 229, as shown in FIG. 2. The deposition ring 229 bridges the gap between the cover ring 220 and rotating pedestal 210 to prevent deposition material from entering therebetween.

Lower shield 218 is provided with an upper end 239 in contact with the upper shield 206, and a lower end 241 opposite the upper end 239. Lower shield wall 243 of lower shield 218 extends from upper end 239 to lower end 241, and has a height H, as shown in FIG. 2. Lower shield wall 243 includes a lower shield wall inner surface 245 that has a straight region 244 that does not have any bends or curves, which minimizes collection of particles. Thus, the lower shield wall inner surface 245 has a contour that is substantially straight to minimize accumulation of particles on the shield. This straight region 244 extends in the embodiment shown from upper end 239 to 0.8H, again as shown in FIG. 2. Thus, in some embodiments, the lower shield 218 comprises a lower shield wall inner surface 245 that extends in a range of from about 50% to about 90% of the height (0.5H-0.9H), in a range of from about 60% to about 90% of the height (0.6H-0.9H), in a range of from about 70% to about 90% of the height (0.7H-0.9H), in a range of from about 75% to about 90% of the height (0.75H-0.9H), in a range of from about 80% to about 90% of the height (0.8H-0.9H), or in a range of from about 85% to about 90% of the height (0.85H-0.9H) of the lower shield. This straight region 244 of the lower shield wall inner surface 245 is, in certain embodiments, free of bends having an angle in a range of from about 0.1 degrees to about 120 degrees and in a range of from about 210 degrees to about 360 degrees. For example, in some embodiments, angle 233 is in the range of from about 150 degrees to about 175 degrees, such as in a range of between about 160 degrees and about 170 degrees.

For purposes of illustration, and not limitation, the lower shield wall inner surface 245 according to one or more embodiments has transition that provides an angle 235 that is in the range of from about 91 degrees to about 120 degrees, such as in a range of from about 100 degrees to about 110 degrees. Angle 237, which is formed by a reference line parallel to the plane or surface of a mask blank, and the outer surface of lower shield liner 223, is in the range of from about 89 degrees to about 65 degrees, such as in the range of from about 85 degrees to about 73 degrees. While other dimensions could be provided to yield angles 233, 235, and 237 outside of these exemplary ranges, there are no bends or sharp curves in the straight region 244 of the lower shield wall inner surface 245 to form a knee, such as knee 119 in FIG. 1. The design according to one or more embodiments that is free of bends or sharp curves in the straight regions avoids collection of particles, thereby minimizing a defect source in the manufacture of articles in the chamber.

Figure 3:
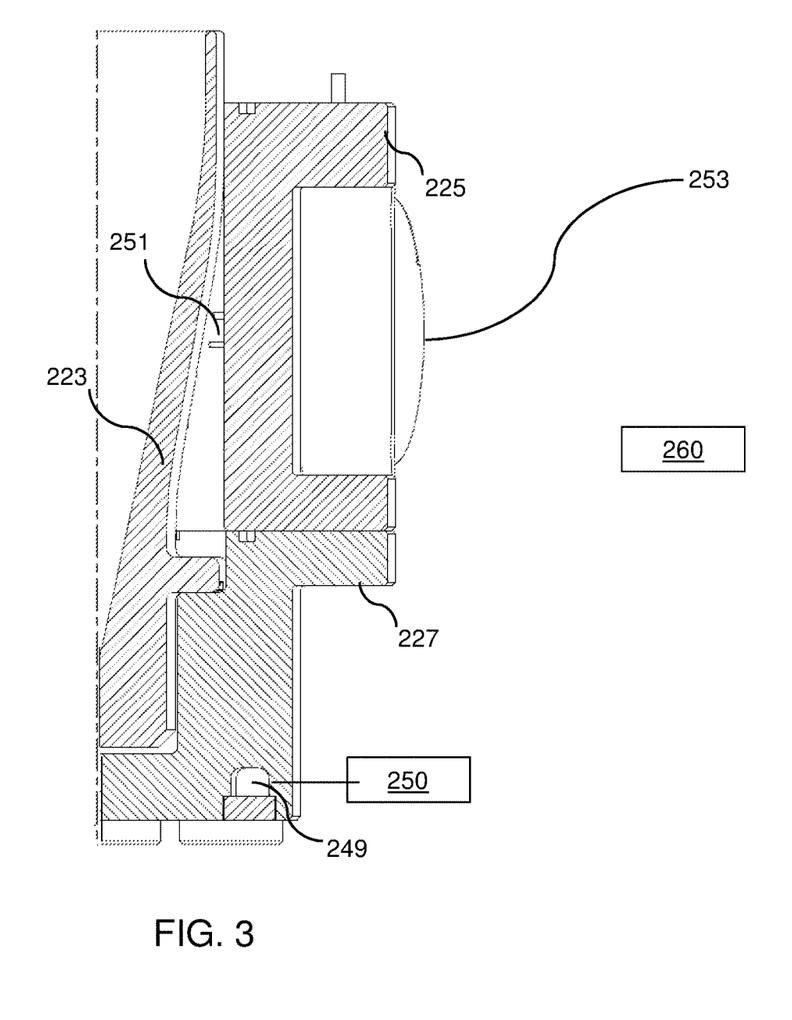
FIG. 3 is an enlarged side view of a portion of the PVD chamber depicted in FIG. 2.

One or more embodiments provide for temperature control of the PVD chamber. As shown in FIG. 3, the lower chamber body 227 is provided with a coolant channel 249, and a temperature measurement device in the form of a thermocouple 251 (e.g., one or more K-type thermocouples) extends from intermediate chamber body 225 toward lower shield liner 223 to contact the lower shield liner 223, or otherwise be positioned to accurately measure a temperature of the lower shield liner 223. The thermocouple 251 is in electronic communication with a controller 260. The coolant channel 249 is in fluid communication with a coolant supply and a valve 250, and the valve 250 is communication with the controller 260 that sends control signals to open and closes the valve based on temperature readings obtained from thermocouple 251 and an automatic temperature control scheme (e.g., a feedback temperature control loop). In one or more embodiments, the coolant is a fluid, for example a liquid coolant such as water.

FIG. 3 depicts a partial side view of the right side of the chamber 200 shown in FIG. 2. In this particular embodiment, a heating element, which in some embodiments is a heating lamp 253 housed within the intermediate chamber body 225. In other embodiments, the heating elements are other types of heating elements such as resistive heating elements. The heating lamp 253 housed with the intermediate chamber body 225 adjacent the lower shield 218 (shown in FIG. 2) to provide temperature control to the chamber 200, and in particular, in the region adjacent the lower shield 218. In some embodiments, a plurality of heating elements are provided around the periphery of intermediate chamber body 225 such that there are plurality of heating elements adjacent the lower shield to heat the chamber. The plurality of heating elements in some embodiments includes any suitable number of heating elements. For example, in some embodiments, four heating elements, such as heating lamp 253 are provided at about 90 degrees increments around the intermediate chamber body 225 to provide uniform heating of the lower shield 218. The plurality of heating elements in some embodiments comprises two, three, four, five, six, seven, eight, nine or ten heating elements according to some embodiments.

In one or more embodiments, the intermediate chamber body 225 is adapted to provide a direct path for the heat from the heating lamps to be directed onto the lower shield liner 223. A controller 260 in some embodiments turns the heating lamps on and off based on a signal received from thermocouple 251 and an automatic temperature control scheme that receives the signal from and sends a signal to the heating lamps.

Figure 4:
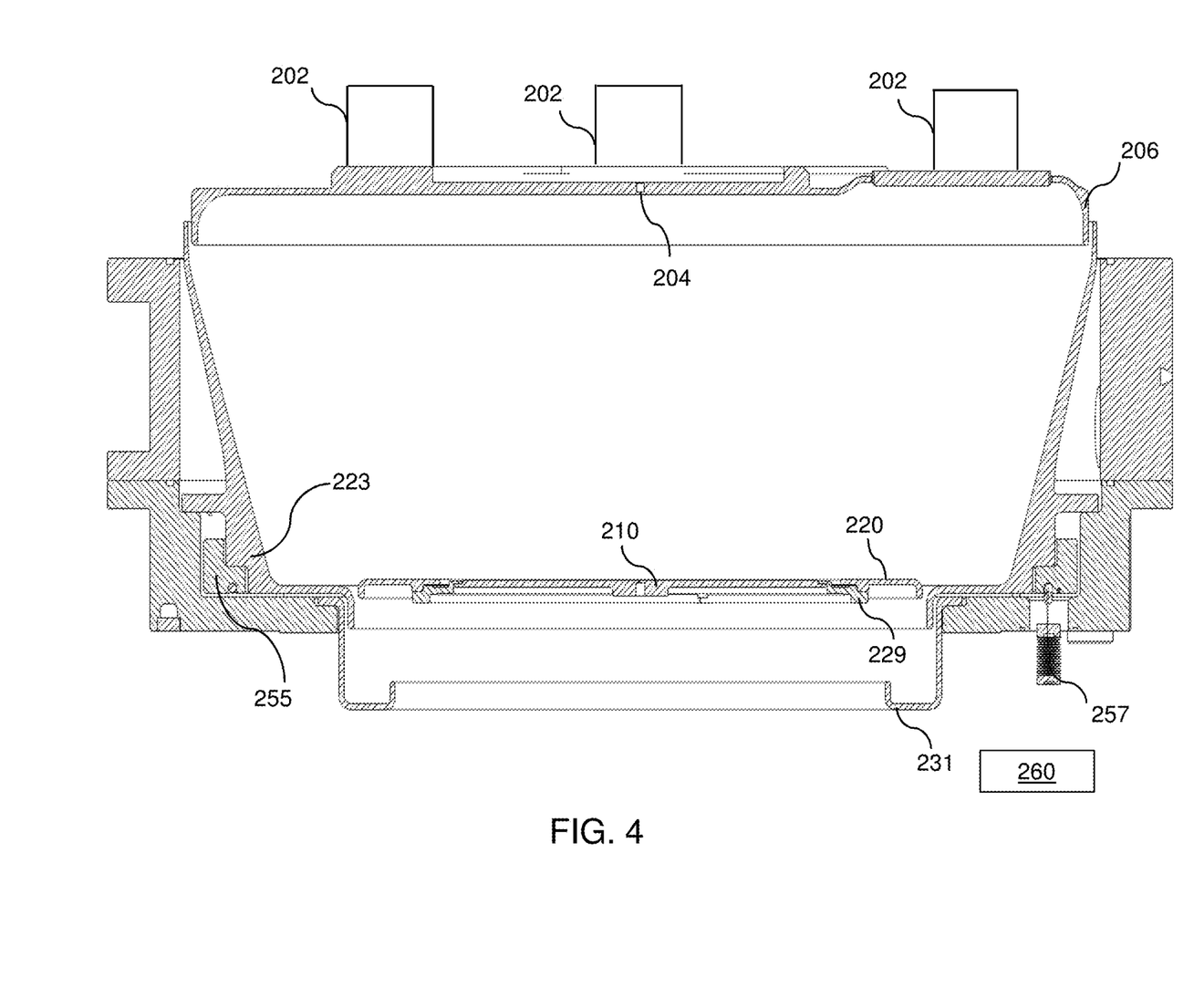
FIG. 4 is an alternative embodiment of a PVD chamber provided with a heating element adjacent to a lower shield liner according to one or more embodiments.
Figure 5:
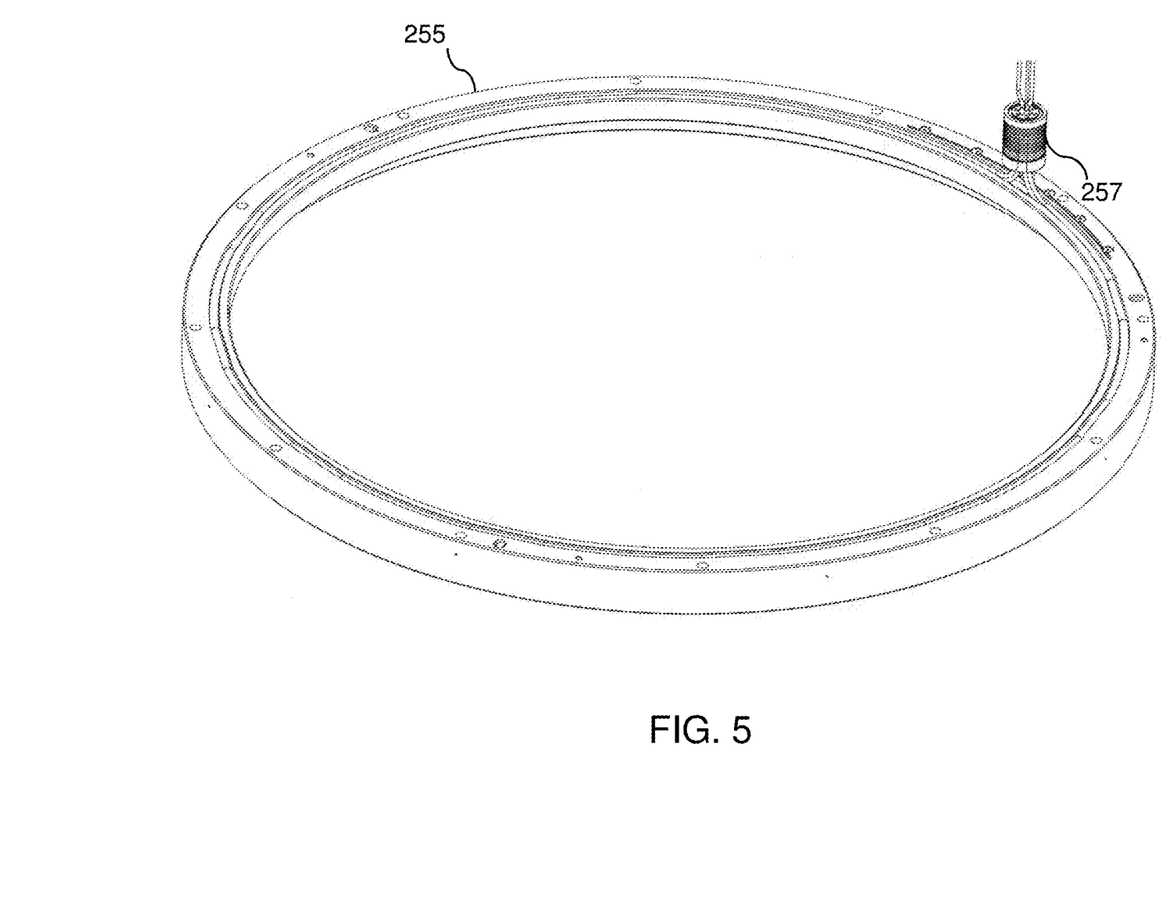
FIG. 5 is an isometric view of the ring heater of FIG. 4.

In some embodiments, as an alternative to lamp 253, or as a supplement thereto, a ring heater 255 provided with a heating element, such as heat coil 257 or other resistance heater, is located adjacent to the lower shield 218, such as along the bottom periphery of the lower shield liner 223, as shown in FIG. 4. As shown in FIG. 5, the ring heater 255 is heated via heating coil 257, though other heating elements could be employed. The heating coil 257 in some embodiments is similarly be controlled by a controller 260 to turn on the heating coil, or increase power to the heating coil, based on output obtained from thermocouple 251.

Figure 6:
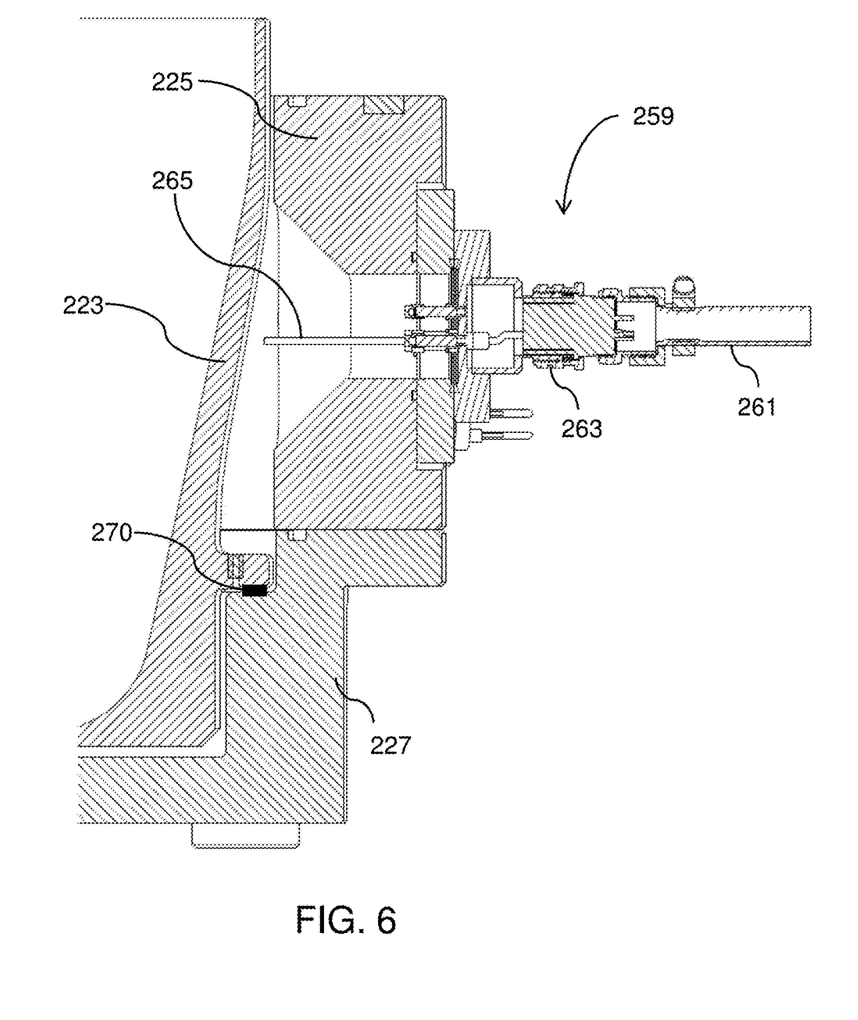
FIG. 6 depicts a voltage particle trap adjacent to a lower shield according to one or more embodiments.

In one or more embodiments, as shown in FIG. 6, the chamber 200 includes a voltage trap 259 housed within the intermediate chamber body 225. A voltage source (not shown) is applied via conduit 261 to head 263, along to leads 265. The leads 265 are connected to the lower shield liner 223 directly, or via one or more bare wires (not shown) to provide voltage to the lower shield liner 223, which in turn traps particles due to the applied electrical charge. The leads 265 do not contact intermediate chamber body 225 or lower chamber body 227. As further shown in FIG. 6, lower chamber body 227 is provided with a ceramic spacer 270 at a location where the lower chamber body 227 is engaged with lower shield liner to insulate the lower chamber body 227 and intermediate chamber body 225 from the electrical charge applied to lower shield liner 223.

The voltage trap in some embodiments applies positive and/or negative potential, such as between from about 50V to about 1000V, to attract positively or negatively-charged free flowing particles moving towards the substrate.

Figure 7:
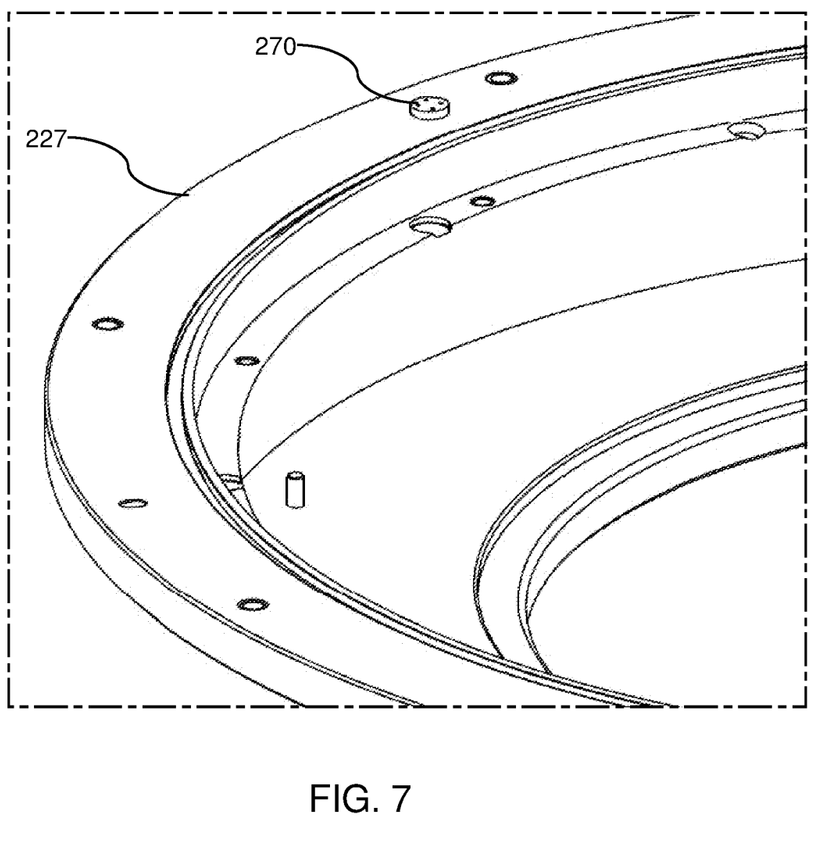
FIG. 7 depicts a partial isometric view of lower chamber body and a ceramic spacer according to one or more embodiments.

FIG. 7 shows a partial isometric view of the lower chamber body 227 and a ceramic spacer 270. The ceramic spacer 270 or other non-conductive spacers in some embodiments are provided in the lower chamber body 227 and/or intermediate chamber body 225, as needed, serve to isolate the applied electrical charge to the lower shield liner 223 from these modular chamber components.

Figure 8:
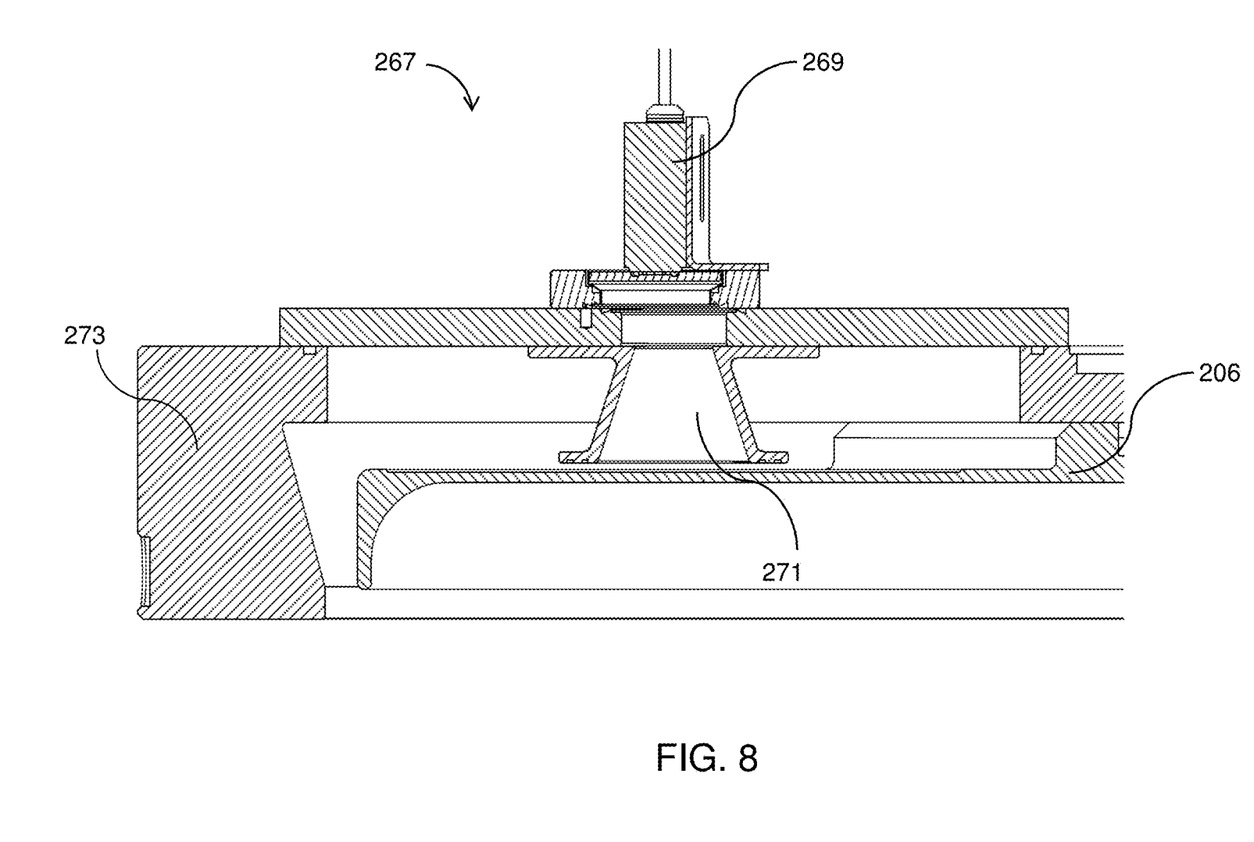
FIG. 8 depicts a temperature sensor disposed above an upper shield according to one or more embodiments.

FIG. 8 depicts a portion of chamber 200 including a second temperature measurement device in the form of a temperature sensor 267 disposed above upper shield 106 and through top adapter 273. The temperature sensor 267 employs an infrared sensor 269 that is positioned above absorber shield 271. The infrared sensor according to one or more embodiments comprises an infrared camera to measure the temperature.

In some embodiments, one controller 260 is utilized to control operation of the chamber 200, including loading of a substrate, deposition conditions, power to the cathode assemblies, as well as temperature control and the voltage trap as described herein. In other embodiments, more than one controller is provided. For example, in some embodiments, a first controller separately controls the deposition conditions and power to the cathode assemblies, a second controller controls temperature and the voltage trap. In other embodiments, a third controller separately controls the function of the voltage trap. When there is more than one controller, each of the controllers is in communication with each of the other controllers to control of the overall functions of the chamber 200. For example, when multiple controllers are utilized, a primary control processor is coupled to and in communication with each of the other controllers to control the system. The controller is one of any form of general-purpose computer processor, microcontroller, microprocessor, etc., that in some embodiments are used in an industrial setting for controlling various chambers and sub-processors. As used herein, "in communication" means that the controller in some embodiments sends and receives signals via a hard-wired communication line or wirelessly.

Each controller in some embodiments comprises a processor, a memory coupled to the processor, input/output devices coupled to the processor, and support circuits to provide communication between the different electronic components. The memory includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory in some embodiments retains an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. In some embodiments, the controller is connected to and configured to operate intermediate components to perform the functions of the methods. For example, the controller is connected to and configured to control one or more of valves (e.g. a valve to a coolant channel), heating elements, actuators, motors, etc.

The chambers 200 assemblies described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer in some embodiments are formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layer of, for example, molybdenum and silicon are formed by physical vapor deposition, for example, in a multi-cathode source chamber.

The PVD chambers 200 described herein are utilized to form the multilayer stack, as well as capping layers and absorber layers. For example, the physical vapor deposition systems in some embodiments form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds in some embodiments include oxides, dioxides, atomic mixtures having oxygen atoms, or a combination thereof.

Thus, in a specific embodiment, a method is provided in which any of the chambers 200 described herein are utilized to perform a method comprising placing a substrate in the PVD chamber comprising an upper and lower shield and heating the lower shield with a plurality of heating elements disposed adjacent the lower shield. In one or more embodiments, the substrate provides structural support to an extreme ultraviolet reflective element such as an EUV reticle. In one or more embodiments, the substrate is made from a material having a low coefficient of thermal expansion (CTE) to provide stability during temperature changes. The chamber may further comprise the temperature sensor 267 and/or thermocouple described herein. The chamber may further comprise one or more heating elements such as the lamps and/or ring heater described herein. The chamber may comprise the controller 260 and which implements an integrated control scheme to control the temperature adjacent the lower shield 218.

Thus in one embodiment, a PVD chamber 200 is provided that comprises a controller 260 in communication with a temperature measurement device (e.g., the temperature sensor 267 and/or thermocouple 251) and one or more heating elements (e.g., the ring heater) and/or adjacent the lower shield 218. The controller is in communication with the one of the temperature measurement devices (e.g., the temperature sensor 267 and/or thermocouple 251), the heating elements (e.g. the ring heater 255 and/or the lamp 253). In some embodiments the controller 260 is in communication with the valve 250 in fluid communication with the coolant channel 249. Thus, in one or more embodiments, the controller 260 is configured to control temperature adjacent the lower shield 218. In one embodiment the controller receives temperature signals from one or more temperature measurement devices, and in response to a temperature setpoint signal that may be communicated from a memory of the controller 260, the heating elements are activated to increase the temperature adjacent the lower shield to provide better temperature control in the PVD chamber 200 during processing of a substrate to form a material layer thereon. The heating elements in some embodiments receive a signal to increase the temperature or to decrease the temperature. In one or more embodiments, the controller is configured to send a signal to the valve 250 in fluid communication with the coolant channel 249 to flow coolant fluid through the coolant channel 249 to reduce the temperature adjacent the lower shield.

In one or more embodiments, the controller 260 (or a separate controller) is in communication with the voltage trap 259. Thus, any of the PVD chambers described herein including an upper shield and a lower shield in one or more embodiments comprise a controller 260 that is configured to send control signals to the voltage trap 259 that is activated so that particles are trapped on the lower shield 218, and the particles are not deposited on the substrate, which would cause defects. Such embodiments are particularly useful in the processing of EUV mask blanks described above.

In a specific method embodiment, a method of depositing a material layer comprises placing a substrate in a PVD chamber comprising a plurality of cathode assemblies, an upper shield below the plurality of cathode assemblies having a shield hole to expose one of the plurality of cathode assemblies, and a lower shield below the upper shield, the lower shield having an upper end in contact with the upper shield, a lower end opposite the upper end, and a lower shield wall comprising a height "H" extending from the upper end to the lower end and a lower shield wall inner surface, wherein the lower shield wall inner surface has a straight region extending from the upper end to about 0.8H wherein the straight region is free of bends on the lower shield wall inner surface having an angle in a range of from about 0.1 degrees to about 120 degrees and in a range of from about 210 degrees to about 360 degrees; and heating the lower shield with a plurality of heating elements disposed adjacent the lower shield. The heating in some embodiments is provided by the heating lamps and/or the heating ring described herein, which are in communication with a controller. The method may further comprise trapping particles on the lower shield utilizing a particle trap mounted adjacent the lower shield. The method in some embodiments further comprises depositing multiple alternating materials layers comprising a first layer comprising molybdenum and a second layer comprising silicon. The method may further comprise depositing a capping layer (e.g. ruthenium) an absorber layer and an antireflective layer over the capping layer to form an EUV mask blank.

In one or more method embodiments described immediately above, the lower shield is surrounded by a modular chamber body comprising at least two body portions. In specific embodiments of the method, the at least two body portions comprise an intermediate chamber body and a lower chamber body, the intermediate chamber body disposed above the lower chamber body. In more specific embodiments, the chamber used in the method embodiments comprises a top adapter disposed above the intermediate chamber body and surrounding the upper shield and a lower shield liner disposed between a) one or more of the intermediate chamber body and the lower chamber body and b) the lower shield.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A physical vapor deposition (PVD) chamber comprising:
   a plurality of cathode assemblies;
   an upper shield below the plurality of cathode assemblies having a shield hole to expose one of the plurality of cathode assemblies; and
   a lower shield below the upper shield, the lower shield having an upper end in contact with the upper shield, a lower end opposite the upper end, and a lower shield wall comprising a height "H" extending from the upper end to the lower end and a lower shield wall inner surface, wherein the lower shield wall inner surface has a substantially straight region extending from the upper end to about 0.8H wherein the substantially straight region has a first bend adjacent the upper end defining a first angle that is not in a range of from about 0.1 degrees to about 120 degrees and the lower shield wall inner surface has a second bend adjacent the lower end defining a second angle, the lower shield wall inner surface having a contour that minimizes accumulation of particles on the lower shield.

2. The PVD chamber of claim 1, wherein the lower shield is surrounded by a modular chamber body comprising at least two body portions.

3. The PVD chamber of claim 2, wherein the at least two body portions comprise an intermediate chamber body and a lower chamber body, the intermediate chamber body disposed above the lower chamber body.

4. The PVD chamber of claim 3, further comprising a top adapter disposed above the intermediate chamber body and surrounding the upper shield and a lower shield liner disposed between a) one or more of the intermediate chamber body and the lower chamber body and b) the lower shield.

5. The PVD chamber of claim 1, further comprising a heating element adjacent to the lower shield.

6. The PVD chamber of claim 5, further comprising a plurality of heating elements.

7. The PVD chamber of claim 6, wherein the plurality of heating elements comprises heating lamps.

8. The PVD chamber of claim 5, wherein the heating element comprises a ring heater disposed adjacent to the lower end.

9. The PVD chamber of claim 1, further comprising a cover ring disposed below the lower shield, the cover ring comprising a peripheral lip defining a sidewall that faces away from the upper shield.

10. The PVD chamber of claim 1, further comprising a voltage particle trap adjacent to the lower shield, the voltage particle trap configured to trap particles.

11. The PVD chamber of claim 1, further comprising a temperature sensor disposed above the upper shield.

12. The PVD chamber of claim 11, wherein the temperature sensor comprises an infrared sensor and a shield.

13. A physical vapor deposition (PVD) chamber comprising:
    a plurality of cathode assemblies;
    an upper shield below the plurality of cathode assemblies having a shield hole to expose one of the plurality of cathode assemblies; and
    a lower shield below the upper shield, the lower shield having an upper end in contact with the upper shield, a lower end opposite the upper end, and a lower shield wall comprising a height "H" extending from the upper end to the lower end and a lower shield wall inner surface, wherein the lower shield wall inner surface has a substantially straight region extending from the upper end to a range of 0.85H to 0.90H, wherein the substantially straight region has a first bend adjacent the upper end defining a first angle that is not in a range of from about 0.1 degrees to about 120 degrees and the lower shield wall inner surface has a second bend adjacent the lower end defining a second angle, the lower shield wall inner surface having a contour that minimizes accumulation of particles on the lower shield; and one or more heating elements adjacent to the lower shield.

14. The PVD chamber of claim 13, wherein the one or more heating elements comprises a plurality of lamps circumferentially arranged around the lower shield.

15. The PVD chamber of claim 13, wherein the one or more heating elements comprises a ring heater disposed adjacent to the lower end.

16. The PVD chamber of claim 13, further comprising a voltage particle trap adjacent to the lower shield configured to trap particles on the lower shield.

17. The PVD chamber of claim 13, further comprising a temperature sensor disposed above the upper shield, the temperature sensor comprises an infrared sensor and a shield.

\* \* \* \* \*